(12) United States Patent
Bueyuektas et al.

(10) Patent No.: US 6,924,725 B2
(45) Date of Patent: Aug. 2, 2005

(54) COIL ON A SEMICONDUCTOR SUBSTRATE AND METHOD FOR ITS PRODUCTION

(75) Inventors: Kevni Bueyuektas, Munich (DE); Klaus Koller, Germering (DE); Karlheinz Mueller, Velden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/945,849

(22) Filed: Sep. 21, 2004

(65) Prior Publication Data
US 2005/0093668 A1 May 5, 2005

Related U.S. Application Data

(63) Continuation of application No. PCT/EP03/02880, filed on Mar. 19, 2003.

(51) Int. Cl.[7] ............................................... H01F 5/00
(52) U.S. Cl. ...................... 336/223; 336/232; 29/602.1
(58) Field of Search ............................... 336/200, 223, 336/232, 192, 83; 29/602.1, 605, 606

(56) References Cited

U.S. PATENT DOCUMENTS

| | | | | |
|---|---|---|---|---|
| 5,354,599 A | * | 10/1994 | McClanahan et al. | 428/209 |
| 6,174,803 B1 | * | 1/2001 | Harvey | 438/638 |
| 6,355,535 B2 | * | 3/2002 | Liou | 438/381 |
| 6,593,224 B1 | * | 7/2003 | Lin | 438/618 |
| 6,717,269 B2 | * | 4/2004 | Shroff et al. | 257/758 |
| 6,727,174 B1 | * | 4/2004 | Kotecki et al. | 438/638 |

* cited by examiner

*Primary Examiner*—Anh Mai
(74) *Attorney, Agent, or Firm*—Maginot, Moore & Beck (57) ABSTRACT

A coil apparatus includes a coil trace, a semiconductor substrate and a dielectric layer arranged on the semiconductor substrate, at least parts of the coil trace being arranged above a recess in the dielectric layer. The coil apparatus further includes a support apparatus arranged in the recess and connected to the coil trace for mechanically supporting the coil trace. The supporting apparatus is preferably a conductive column that is not removed when the recessed is formed in the dielectric layer.

20 Claims, 6 Drawing Sheets

COIL ON A SEMICONDUCTOR SUBSTRATE AND METHOD FOR ITS PRODUCTION

CROSS-REFERENCE TO RELATED APPLICATION

This application is a continuation of co-pending International Application No. PCT/EP03/02880, filed Mar. 19, 2003, which designated the United States and was not published in English and is incorporated herein by reference in its entirety.

BACKGROUND OF THE INVENTION

1. Field of the Invention

The present invention relates to a coil on a semiconductor substrate, in particular to a high-quality coil, and to a method of producing same.

2. Description of the Related Art

Many integrated semiconductor packages and/or semiconductor chips contain coils. When producing a semiconductor package, a device layer having a plurality of diodes, transistors or other semiconductor devices is created on the surface of a silicon substrate. Several layers of wiring which contain metallic wiring conductor tracks for wiring the devices and in addition may contain capacitors, coils etc., are created above the device layer. Electrically insulating intermetal dielectric layers for electrically insulating the wiring conductive tracks, or wiring traces, are arranged between the layers of wiring. Coils are produced, in or on the layers of wiring, in the form of spiral-shaped traces that may comprise several spiral turns and various geometries, the ends of the coil being contacted electrically as the input and the output. The material of the coil trace may comprise aluminum, aluminum alloys, copper or other conductive materials, in particular metals, just like the material of the wiring traces.

In particular in high-frequency applications, quality is one of the most important parameters of a coil and should be as high as possible. The quality of the coil is determined by any power losses, i.e. among other things, by the electrical resistance of the coil trace, so that the quality of the coil may be influenced by the choice of material of the coil trace and/or of the conductive layer forming the coil. In addition, the quality of a coil is influenced to a significant degree by a coupling of the coil to surrounding matter. To produce high-quality, high-frequency coils, efforts have generally been made to reduce these losses caused by coupling to the substrate.

One possibility of improving the quality of a coil is to reduce, or minimize, the losses by the correct choice of dopant of the silicon substrate when using a silicon substrate. However, in many cases the dopant of the silicon substrate cannot be chosen freely since it typically is linked, at the same time, to other properties of the silicon substrate, for example to its suitability for certain devices or arrangements of devices.

A further possibility of improving the quality of a coil is to incorporate a shield between the coil and the substrate. However, this typically involves a fair amount of work and considerable extra cost in production, and is therefore unsuitable for many applications.

In addition, both the choice of the dopant of the silicon substrate and incorporation of a shield may achieve only a slight improvement in the quality of the coil.

A further possibility is to remove the silicon substrate underneath the coil. However, this also requires labor-intensive and cost-intensive additional steps in the manufacturing process.

US 2001/0016409 A1 describes an inductive element with high quality Q. The inductive element is comprised of conductors arranged above a cavity formed in insulating layers, and held by support structures. The cavity is filled with parylene C, polyimide, a foam, or air. The support structures arise from the insulating layers when forming the cavity by etching.

EP 1039544 A1 describes a monolithically integrated circuit with an inductor. The inductor has copper turns disposed on a silicon oxide layer. Between the silicon oxide layer and an opposing passivation layer, a cavity is disposed. A gold layer is provided on the turns.

US 2002/0008301 A1 describes a monolithical inductance device with high quality Q. In an area below a coil formed of a stack of parallel spiral-shaped conductive lines, a first insulating layer is replaced by a second insulating layer with a lower dielectric constant.

U.S. Pat. No. 6,140,197 A describes a spiral-shaped high-frequency inductor with high quality Q. At first, openings, which are the closed by a thin oxide layer, are created in an inter-metal dielectric layer. The inductor is created on the thin oxide layer.

U.S. Pat. No. 6,180,995 B1 describes an integrated passive device with reduced parasitic capacity to the substrate. A metal spiral-shaped inductor or a capacitor is disposed over an air gap in an epitactic layer. Over the epitactic layer, at first a field oxide layer is formed and provided with a plurality of openings. By means of an isotropically acting etching medium, the air gap is created below the openings in the field oxide layer. By conformly depositing an oxide, the openings in the field oxide layer are closed before the inductive spiral is formed. Alternatively, metal lines are formed in the field oxide layer before openings and an air gap are created.

US 2001/0028098 A1 describes an inductor with high quality Q. After the forming of a coil from spiral-shaped metal lines, spiral-shaped trenches are created therebetween.

U.S. Pat. No. 6,287,931 B1 describes a method of producing an on-chip inductor. In a semiconductor substrate, a trench is formed and filled with an insulating layer having lower relative permittivity than silicon oxide. Over the trench or the insulating layer filling it, a spiral-shaped conductive coil is formed.

SUMMARY OF THE INVENTION

It is the object of the present invention to provide a simpler, high-quality coil means and/or a simplified method for producing a high-quality coil.

In accordance with a first aspect, the present invention provides a coil means having a coil trace; a semiconductor substrate; and a dielectric layer arranged on the semiconductor substrate, wherein at least parts of the coil trace are arranged above a recess in the dielectric layer, further having a supporting means arranged in the recess and connected to the coil trace for mechanically supporting the coil trace, wherein the supporting means has a stack of through-hole conductors and wiring conductor pieces arranged on top of each other.

In accordance with a second aspect, the present invention provides a method for producing a coil at a semiconductor substrate, with the steps of creating a dielectric layer on the semiconductor substrate; creating a coil trace on the dielectric layer; creating a recess in the dielectric layer between the coil trace and the semiconductor substrate; and generating a supporting means prior to creating the coil trace, such that, after creating the recess, the support means is arranged within the recess and connected to the coil trace, for mechanically supporting the coil trace, wherein the supporting means has a stack of through-hole conductors and wiring conductor pieces arranged on top of each other.

A coil means in accordance with the present invention includes a coil trace, a semiconductor substrate and a dielectric layer arranged on the semiconductor substrate, at least parts of the coil trace being arranged above a recess in the dielectric layer.

A method for producing a coil on a semiconductor substrate includes a step of creating a dielectric layer on the semiconductor substrate, a step of creating a coil trace on the dielectric layer, and a step of creating a recess in the dielectric layer, between the coil trace and the semiconductor substrate.

The present invention is based on the findings that dielectric layers underlying the coil exert a large amount of influence on the coupling of a coil to surrounding matter, and therefore on its quality. By means of parasitic capacitances, currents which lead to resistive heating of the substrate and thus take away power from the alternating electromagnetic field of the coil, are induced in the semiconductor substrate. The smaller the amount of coupling of the coil to the substrate, the smaller, as a consequence, the power loss deposited in the substrate by the coil, and the higher the quality of the coil. By removing insulating layers beneath the coil in a pinpointed manner, a relative permittivity of close to 1, i.e. corresponding to that of air, may be achieved there.

The parasitic capacitances are determined, above all, by the dielectric layers which in most cases have a dielectric constant (dc), or relative permittivity $\epsilon_r$, of well above 2. When using oxidic layers manufactured by plasma-supported chemical vapor deposition, $\epsilon_r$ is between 3 and 4. Therefore, an improvement in the quality of the coil may also be achieved by using organic materials having a lower relative permittivity $\epsilon_r$ in the dielectric layers.

Due to the recess, the electromagnetic coupling between the coil and the substrate is considerably reduced in the inventive coil means and/or in the coil manufactured in accordance with the invention, which results in smaller substrate losses and improved coil quality. In initial measurements, an improvement of the coil quality of up to 100% was found.

A further advantage of the present invention is the fact that the coil means may be produced at low cost and efficiently with standard processes of semiconductor production, and/or that the inventive production process may be carried out with standard processes and may therefore be integrated into semiconductor production in a simple and straightforward manner.

A further advantage is the fact that the resonance-vibration frequency range may be raised due to the clearly reduced parasitic capacitances. This leads to a considerable expansion of the spectrum of possible uses of an inventive coil means and/or of a coil produced in accordance with the invention as compared to a conventional coil. In addition, a frequency range, the bandwidth of which is increased by a factor of 2, results for the range of the quality Q (plateau in the frequency dependence of quality).

A particularly preferred application of the invention is related to highly-integrated bipolar, BiCMOS or CMOS processes.

A further advantage of the present invention is that it provides a significantly enlarged area of application for existing coil designs and/or coil types due to the improvements described without requiring additional adjustments in terms of layout or material properties.

BRIEF DESCRIPTION OF THE DRAWINGS

Preferred embodiments of the present invention will be explained below in more detail with reference to the accompanying figures, in which.

DESCRIPTION OF THE PREFERRED EMBODIMENTS

Figure 1:
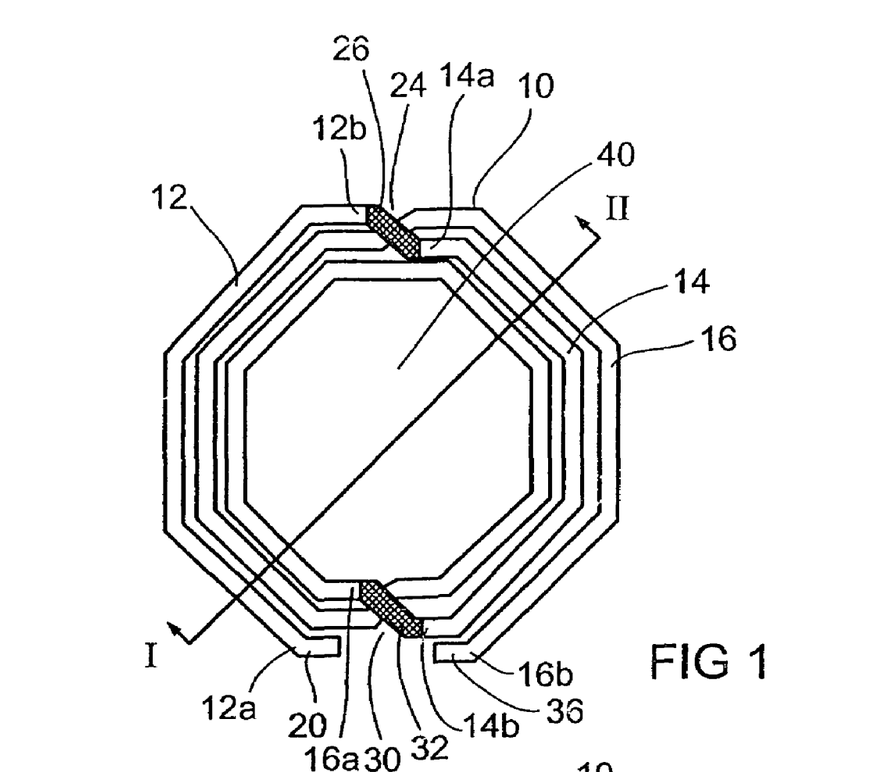
FIG. 1 shows a schematic top view of a coil trace of a coil means in accordance with a first preferred embodiment of the present invention.

FIG. 1 is a schematic top view of a coil in accordance with a first embodiment of the present invention. The coil is formed by a coil trace 10 with several sections 12, 14, 16 which are arranged concentrically to one another approximately in the form of sub-sections of regular octagons. The first section 12 of the coil trace 10 includes a first contacting area 20 at a first end 12a. A second end 12b of the first section is connected to a first end 14a of the second section in an electrically conductive manner via a first connector piece 26 in a first crossing area 24, the first connector piece 26 crossing the third section 16 and being electrically insulated from same by an insulating layer (not shown). A second end 14b of the second section 14 is connected, via a second connector piece 32, to a first end 16a of the third section 16 in an electrically conductive manner in a second crossing area 30, the second connector piece 32 crossing the third section 16 and being electrically insulated from same by an insulating layer (not shown). A second end 16b of the third section 16 is formed as a second contacting area 36. The first section 12, the first connector piece 26, the second section 14, the second connector piece 32 and the third section 16 together form the coil trace 10 wound around the interior 40 of the coil trace 10 in three turns.

Figure 2A:
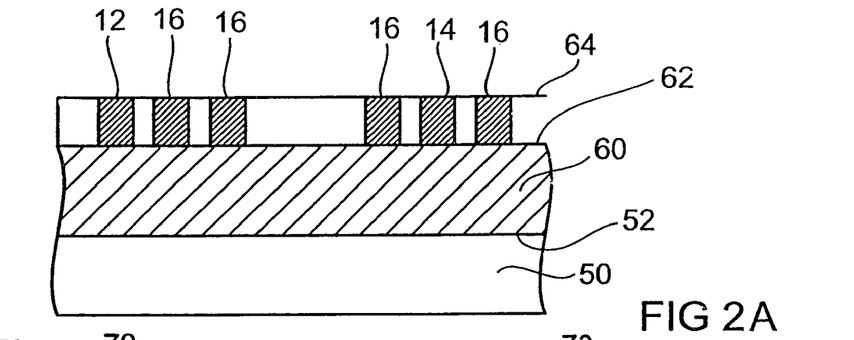
FIGS. 2A to 2C show schematic sectional views of the coil of FIG. 1.
Figure 2B:
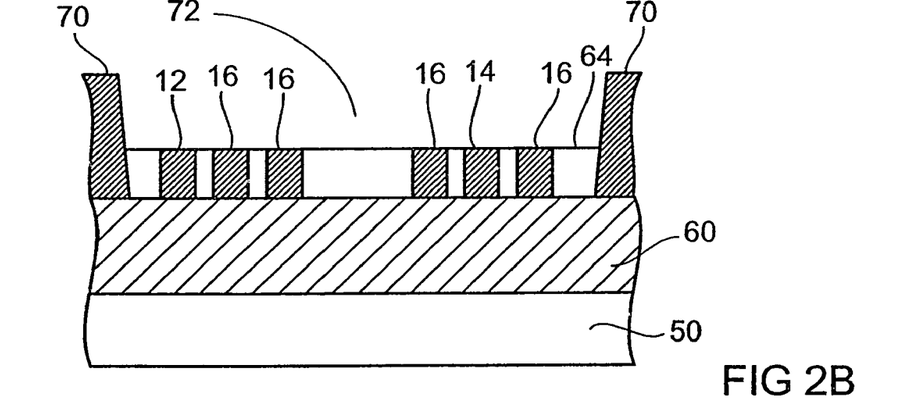
Figure 2C:
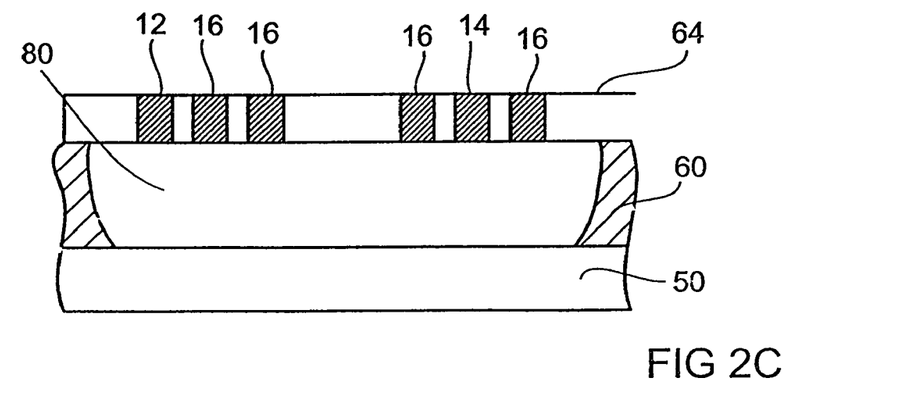

FIGS. 2A to 2C show schematic representations of a vertical section along the line I–II in FIG. 1 during production of a coil with the coil trace 10 above a semiconductor substrate 50.

One or several devices (not shown), for example diodes or transistors, are initially produced on a first surface 52 of the semiconductor substrate 50. For wiring the devices on the surface 52 of the substrate 50, one or several layers of wiring are subsequently formed on the surface 52. Each layer of wiring consists of one or several wiring conductor tracks. Each wiring conductor track not formed directly on the surface 52 of the substrate 50 is formed on a surface of an intermetal dielectric layer electrically insulating the wiring traces of different layers of wiring from each other. For electrically connecting two wiring traces in adjacent layers of wiring, a through-hole conductor is formed which is arranged in the intervening intermetal dielectric layer and is arranged perpendicular to same. For the purpose of a simple and clear representation, the intermetal dielectric layers on the surface 52 of the substrate 50 will be collectively referred to and represented as dielectric layer 60, a representation of wiring traces and through-hole conductors being omitted. It is irrelevant for the present invention whether the dielectric layer 60 consists of one or several intermetal dielectric layer(s) and whether or not it contains wiring traces.

Eventually, the coil trace 10 is formed on a surface 62 of the dielectric layer 60, the surface 62 facing away from the substrate 50. This leads to the state represented in FIG. 2A. Here, line 64 designates a background structure. Subsequently, a mask 70, for example a photoresist mask, which comprises an opening 72 in the area of the coil trace 10, is formed on the surface 62 of the dielectric layer 60. This leads to the state represented in FIG. 2B.

The opening 72 of the mask 70 defines the sphere of action of a subsequent etching step, wherein all areas of the dielectric layer 60 which are covered by the mask 70 are protected from any exposure to the etching medium. In the etching step, a cavity, or a recess, 80 is created underneath the coil trace 10 by means of isotropic etching or of a combination of non-isotropic and isotropic etching. As etching methods, wet-chemical etching methods or plasma-supported chemical dry etching methods are considered, for example. Here, etching is preferably selective both with regard to the mask 70 and with regard to the coil trace 10, i.e. the etching method is selected such that neither the mask 70 nor the coil trace 10 are ablated to any considerable extent. Alternatively, there is also the possibility of depositing an additional layer on the coil trace 10 to protect same during the etching step. After the recess 80 has been created, the mask 70 is removed. This leads to the state represented in FIG. 2C.

In a subsequent processing step, the conductive, spiral-shaped metal layer forming the coil trace 10 is provided with a passivation layer 84 preferably covering the entire surface area of the coil trace 10, or sheathing the coil trace 10. The passivation layer is preferably produced as an oxide or nitride layer by means of plasma-supported chemical vapor deposition, and serves as a corrosion protection for the coil trace. Finally, the passivation layer is removed in the contacting areas 20, 36 to expose the coil trace 10 and make it accessible for electrical contact.

To ensure a mechanical connection between the substrate 50 and the coil trace 10 after forming the recess 80, the lateral extension of the opening 72 and therefore the resulting lateral extension of the recess 80, for example, may be selected such that the recess 80 does not extend underneath the entire coil trace 10, but rather such that the dielectric layer 60 is preserved underneath part of the coil trace 10, for example underneath the contacting areas 20, 36, or the crossing areas 24, 30.

For ensuring sufficient mechanical stability of the coil trace, it preferably comprises a stiff material.

Figure 3:
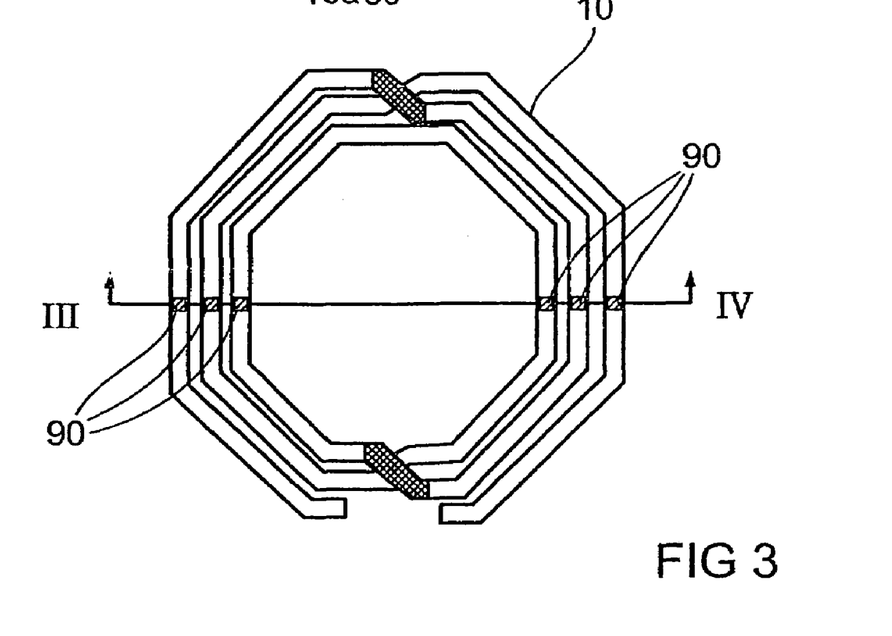
FIG. 3 shows a schematic top view of a coil trace of a coil means in accordance with a second preferred embodiment of the present invention.
Figure 4:
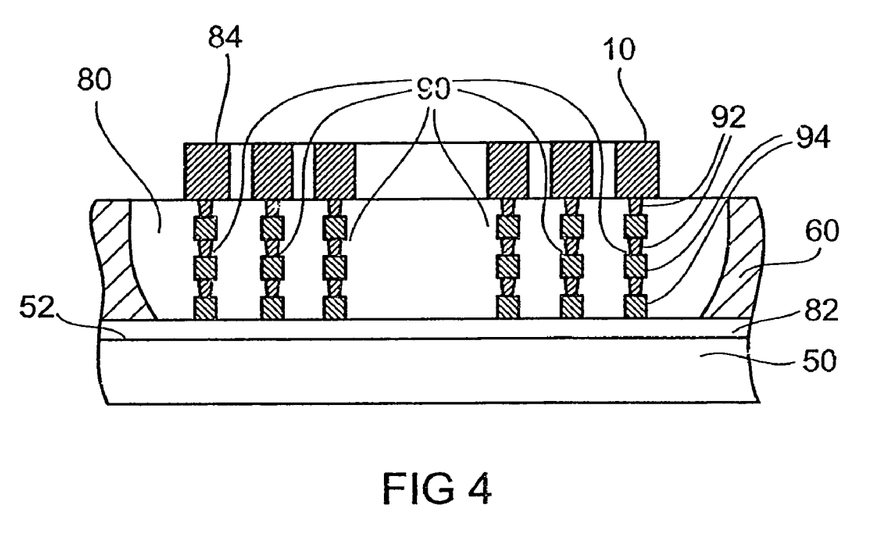
FIG. 4 shows a schematic sectional view of the coil of FIG. 3.

An alternative embodiment of the inventive coil means is represented in FIGS. 3 and 4. The substrate of this coil means differs from that represented by means of FIGS. 1 and 2 in that an electrically insulating field oxide layer (FOX) is provided between the substrate 50 and the dielectric layer 60, i.e. on the surface 52 of the substrate 50.

FIG. 3 is a schematic top view of the alternative embodiment of the present invention. In this embodiment, the coil trace 10 comprises the same structure as that in the embodiment represented in FIG. 1. However, one difference is that in the embodiment represented in FIG. 3, supporting positions/nodes, or supporting means, 90 mechanically connecting the coil trace 10 to the full-area field oxide layer are provided underneath the coil trace 10.

FIG. 4 is a schematic representation of a section through the coil trace 10 surrounded by a passivation layer 84, and through the supporting means 90 along line III-IV in FIG. 3. Unlike the preceding embodiment, the field oxide layer 82 is provided on the surface 52 of the substrate 50, the field oxide layer 82 being applied over the entire area and having a dielectric layer 60 on it. The coil trace 10 is arranged above a recess 80 in the dielectric layer 60. It can be seen in the sectional representation that the supporting means 90 are arranged in the recess 80 such that they create mechanical connections between the substrate 50 and/or the field oxide layer 82, on the one hand, and the coil trace 10, on the other hand. Since the field oxide layer 82 comprises electrically insulating material, it prevents an electrical short circuit between the coil trace 10 and the substrate.

The supporting means 90 are preferably formed as early as in the production of the dielectric layer 60 in the form of stacks of through-hole conductors 92 and wiring conductor pieces 94 arranged on top of each other, respectively. The through-hole conductors 92 and the wiring conductor pieces 94 of the supporting means 90 are formed together with and concurrently with non-represented through-hole conductors and wiring conductors provided for wiring devices in the substrate 50. Therefore the forming of the supporting means 90 does not require any additional steps but merely a simple modification of the masks used for producing through-holes and wiring conductors. Here, the wiring conductor pieces 94 forming the supporting means 90 are, in the simplest case, small square or circular islands.

The supporting means 90 are necessary and advantageous if, due to the geometry of the coil trace 10 and/or due to the mechanical properties of the materials used, deformation of the coil trace 10 were possible without the supporting means 90. The supporting means 90 prevent any deformation of the coil trace 10 towards the substrate 50 or away from same due to electrostatic or magnetic forces or due to external influence.

To avoid any short-circuiting of the coil trace 10 with a device in the substrate 50 via a supporting means 90, the field oxide layer 82 is provided. Alternatively, the arrangement of the supporting means 90 will be selected such that they border on insulating or insulated areas of the surface 52 of the substrate 50. As a further alternative, an electrically insulating layer is provided between the coil trace 10 and the supporting means 90. Insulation of the supporting means 90 from the surface 52 of the substrate 50 is also given if the recess 80 in the dielectric layer 60 has a depth smaller than the thickness of the dielectric layer 60, in other words, if a remainder of the material of the dielectric layer 60 remains between the recess 80 and the surface 52 of the substrate 50 in which no wiring conductor pieces 94 and through-hole conductors 92 are provided.

Figure 5A:
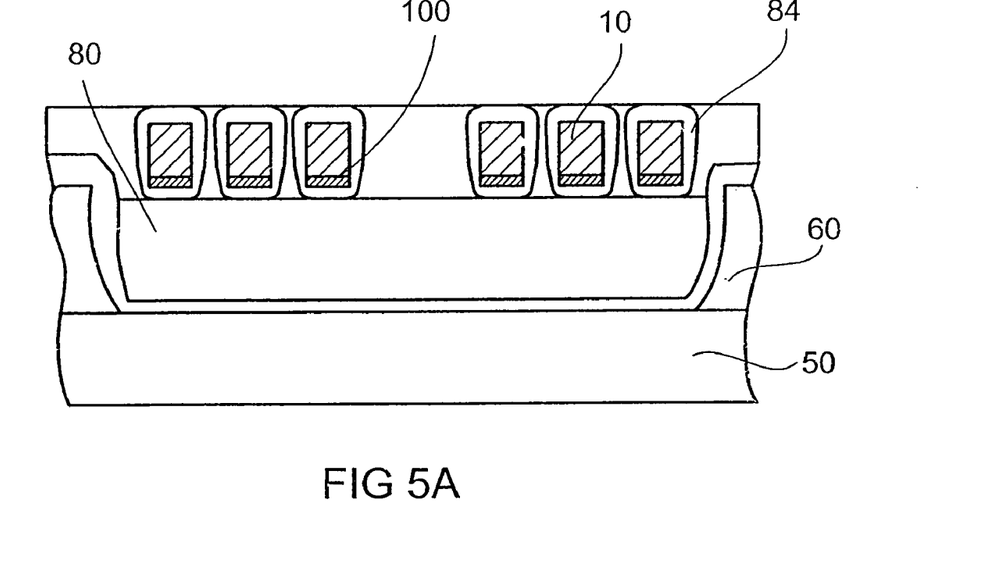
FIG. 5A shows a schematic sectional view of a coil in accordance with a third embodiment of the present invention.

FIG. 5A shows a schematic representation of a section through a coil means in accordance with a third embodiment. This embodiment differs from the first embodiment in that a stiffening layer 100 is provided underneath the coil trace 10, the stiffening layer 100 consisting of a material which is stiffer than that of the coil trace 10, and being provided for mechanically stiffening and stabilizing the coil trace. This stiffening layer allows a use of soft coil materials and/or a use of a smaller number of supporting means 90 and/or omission of supporting means 90 and/or a larger recess 80. This creates additional degrees of freedom in the construction and geometric layout of the coil means and in the choice of material for the coil trace 10.

In the third embodiment, a passivation sheathing, or passivation layer, 84 is further represented, which has already been shown in FIG. 4 but has a larger thickness of layer here.

Figure 5B:
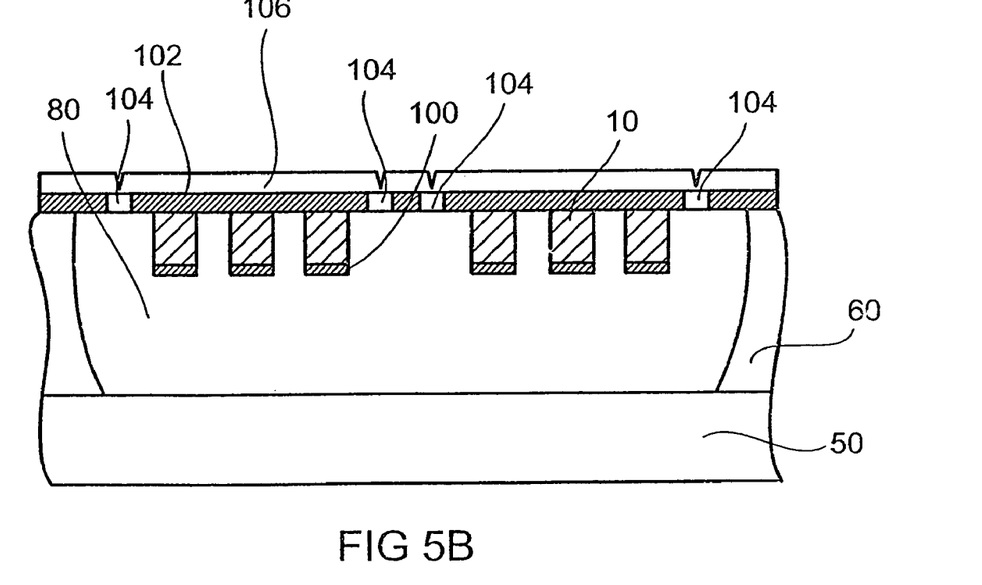
FIG. 5B shows a schematic sectional view of a coil in accordance with a fourth embodiment of the present invention.

FIG. 5B shows a schematic representation of a section through a coil means in accordance with a fourth embodiment. This embodiment differs from the first embodiment in that a supporting layer 102 is provided on the coil trace 10, the supporting layer 102 comprising, in the form of an aperture mask for producing the recess 80, holes 104 through which an etching medium creating the recess 80 may pass. The supporting layer 102 has a mechanical support function and thus improves mechanical stability of the coil trace 10. Instead of the passiviation layer 84 sheathing the coil trace 10, as is shown in FIGS. 4 and 5A, a passivation layer 106 is provided on the support layer 102, the thickness of the passivation layer 106 preferably being selected such that the holes 104 of the supporting layer 102 are closed up by the passivation layer 106.

Figure 6:
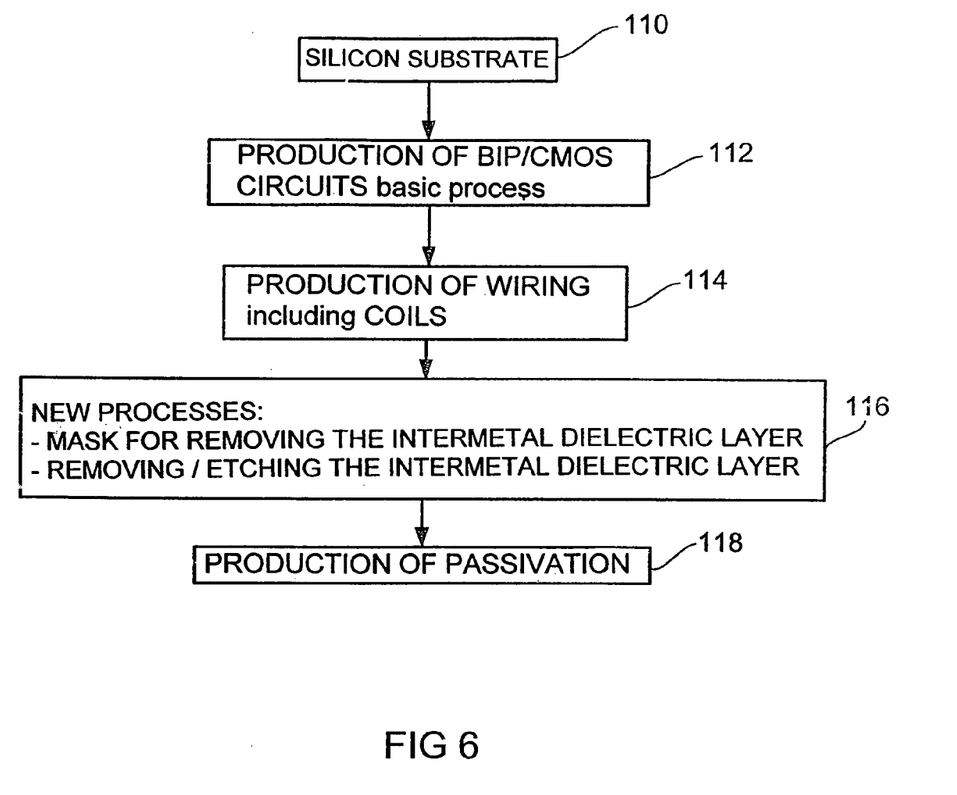
FIG. 6 shows a schematic representation of the inventive production method in a flow chart.

FIG. 6 is a simplified flow chart representing the production of a coil means in accordance with the present invention. Starting point 110 of the method is a silicon substrate, on the surface of which bipolar/CMOS circuits, for example, are manufactured in a first step 112. In a second step, the bipolar/CMOS devices are wired, by means of wiring traces, in one or several layers of wiring. As has been described above, a coil (or several coils) is produced on the layers of wiring concurrently or subsequently.

In accordance with the present invention, a mask is now applied, in a third step, defining an area in the coil in which the intermetal dielectric layers are removed in an etching step. After removing the mask, the coil trace 10 is provided with a passivation layer in a fourth step.

Figure 7:
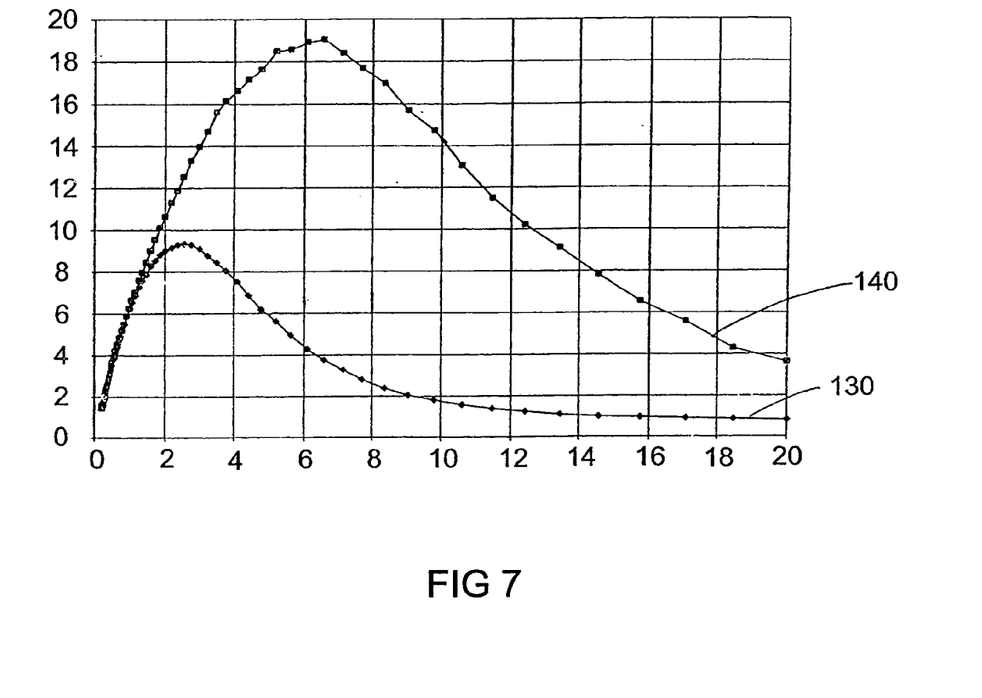
FIG. 7 shows a schematic representation of the resonance-vibration frequency ranges of an inventive coil and a conventional coil.

FIG. 7 is a schematic representation of the results of measurements of the frequency dependence of quality in a conventional coil and a coil in accordance with the present invention. The operating frequency f is plotted, in GHz, on the abscissa, quality Q is plotted on the ordinate. A curve 130 shows the frequency dependence of the quality of the conventional coil, a curve 140 shows the frequency dependence of the quality of the coil in accordance with the present invention. It can be seen that both coils have substantially the same quality up to a frequency f of approximately 1 GHz. However, while the quality of the conventional coil has a maximum of approximately Q=9 between 2 GHz and 3 GHz and rapidly approaches a value of Q= 1 at higher frequencies, the quality of the inventive coil does not reach a maximum before from 6 GHz to 7 GHz, which maximum of Q=19 is more than double that of the maximum quality of the conventional coil. The quality Q of the inventive coil also decreases at frequencies above 7 GHz, but still is about four times the quality of the conventional coil even at the maximum frequency represented, 20 GHz. The inventive coil may thus be used at significantly higher frequencies than the conventional coil. For this reason and due to the maximum quality being double that of conventional coils, completely new areas of application have opened up to the inventive coil, for which so far only such coils have been suitable which have been more expensive and have taken considerably more trouble to produce.

In the embodiments the inventive coil, or coil means, has been described as being situated on a silicon substrate. However, it may just as well be realized on a GaAs substrate or on any other semiconductor substrate. In addition, the coil trace 10 need not have the approximately octagonal shape shown in FIGS. 1 and 3 but may have any desired form with or without crossing areas and may comprise any number of turns. The coil trace 10 may comprise any conductive material, with copper, aluminum, silver and other materials having high specific conductivity being particularly suited to achieving low electrical resistance. Here, the number and arrangement of the supporting means 90 are to be selected, if need be, such that they effectively prevent deformation of the coil trace and that any devices arranged at the substrate beneath the coil trace are not negatively affected. Since it is true that the less matter is present between the coil trace 10 and the substrate 50, the smaller is the effective or mean relative permittivity, $\epsilon_{r, \mathit{eff}}$, which influences the coupling of the coil to the substrate to a considerable extent, the depth and the lateral extension of the recess 80 are preferably selected to be as large as possible. However, due to the excellent effect the recess has on the quality of the coil, as can be seen in FIG. 7, even relatively small recesses, which are arranged underneath only part of the coil trace, already lead to a marked improvement in the quality of the coil. Two or more relatively small recesses may be provided instead of one relatively large recess, it being possible for areas or ridges of the dielectric layer 60, which remain between the recesses, to perform the function of the supporting means 90.

At the end of the production process, the cavity 80 may be filled with a material having a considerably lower relative permittivity than the dielectric layer 60. Hereby, the advantage of the reduced relative permittivity is combined with the advantage of high mechanical stability.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A coil apparatus, comprising:
    a coil trace;
    a semiconductor substrate; and
    a dielectric layer arranged on the semiconductor substrate, wherein at least parts of the coil trace are arranged above a recess in the dielectric layer, wherein the coil apparatus further comprises a support apparatus arranged in the recess and connected to the coil trace for mechanically supporting the coil trace, and wherein the support apparatus comprises a stack of through-hole conductors and wiring conductor pieces arranged on top of each other.

2. The coil apparatus as claimed in claim 1, further comprising a stiffening layer arranged on a side of the coil trace which faces the recess.

3. The coil apparatus as claimed in claim 1, further comprising a supporting layer arranged on a side of the coil trace which faces away from the recess.

4. The coil apparatus as claimed in claim 1, wherein a depth of the recess is substantially equal to a thickness of the dielectric layer.

5. The coil apparatus as claimed in claim 1, further comprising a passivation layer covering at least a portion of a surface of the coil trace.

6. The coil apparatus as claimed in claim 1, wherein the coil apparatus comprises a high-frequency coil apparatus.

7. The coil apparatus as claimed in claim 1, further comprising an electrically insulating layer arranged between the semiconductor substrate and the dielectric layer.

8. The coil apparatus as claimed in claim 1, further comprising an electrically insulating layer arranged between the semiconductor substrate and the recess.

9. A method for producing a coil at a semiconductor substrate, comprising:
 creating a dielectric layer on the semiconductor substrate;
 creating a coil trace on the dielectric layer;
 creating a recess in the dielectric layer between the coil trace and the semiconductor substrate; and
 generating a support apparatus prior to creating the coil trace, such that, after creating the recess, the support apparatus is arranged within the recess and connected to the coil trace, for mechanically supporting the coil trace, wherein the support apparatus comprises a stack of through-hole conductors and wiring conductor pieces arranged on top of each other.

10. The method as claimed in claim 9, wherein the step of creating the recess further comprises:
 creating a mask on the dielectric layer, the mask comprising an opening, the shape of which determines a lateral shape of the recess; and
 removing the dielectric layer in the area of the opening of the mask to obtain the recess.

11. The method as claimed in claim 10, wherein the removing step further comprises a step of isotropic etching.

12. The method as claimed in claim 9, further comprising a step of creating a passivation layer on a surface of the coil trace.

13. The method as claimed in claim 9, further comprising a step of filling the recess with a material, the relative permittivity of which is smaller than the relative permittivity of the dielectric layer.

14. A method for producing a coil at a semiconductor substrate, comprising:
 forming at least one vertical conductor column in a dielectric layer disposed on the semiconductor substrate;
 forming a coil trace on the dielectric layer, the coil trace mechanically coupled to said at least one vertical conductor column in the dielectric layer;
 creating a recess in the dielectric layer between the coil trace and the semiconductor substrate, the recess including the at least one vertical conductor column, the at least one vertical conductor column configured to mechanically support the coil trace.

15. The method as claimed in claim 14, wherein the step of creating the recess further comprises:
 creating a mask on the dielectric layer, the mask comprising an opening, the shape of which determines a lateral shape of the recess; and
 removing the dielectric layer in the area of the opening of the mask to obtain the recess.

16. The method as claimed in claim 15, wherein the removing step further comprises a step of isotropic etching.

17. The method as claimed in claim 14, further comprising a step of creating a passivation layer on a surface of the coil trace.

18. The method as claimed in claim 14, further comprising a step of filling the recess with a material, the relative permittivity of which is smaller than the relative permittivity of the dielectric layer.

19. The method as claimed in claim 14, wherein forming the at least one vertical conductor column further comprises forming a plurality of conductive surface elements and a plurality of conductive through-holes in the dielectric layer, and wherein at least some of the conductive surface elements and at least some of the conductive through-holes cooperate to form the vertical conductor column.

20. The method as claimed in claim 19, wherein the step of creating the recess further comprises:
 creating a mask on the dielectric layer, the mask comprising an opening, the shape of which determines a lateral shape of the recess; and
 removing the dielectric layer in the area of the opening of the mask to obtain the recess.

* * * * *